United States Patent [19]

Tang

[11] Patent Number: 5,999,052
[45] Date of Patent: Dec. 7, 1999

[54] HIGH SPEED, FINE-RESOLUTION GAIN PROGRAMMABLE AMPLIFIER

[75] Inventor: Zhi-Long Tang, Allentown, Pa.

[73] Assignee: Lucent Technologies Inc., Murray Hill, N.J.

[21] Appl. No.: 09/067,440

[22] Filed: Apr. 28, 1998

[51] Int. Cl.[6] .................................................. H03F 3/45
[52] U.S. Cl. ......................................... 330/254; 330/253
[58] Field of Search ..................................... 330/254, 256, 330/253

[56] References Cited

U.S. PATENT DOCUMENTS

| | | | |
|---|---|---|---|
| 5,301,072 | 4/1994 | Wilson | 360/77.01 |
| 5,410,729 | 4/1995 | Kumagai et al. | 455/12.1 |
| 5,451,901 | 9/1995 | Welland . | |
| 5,576,976 | 11/1996 | White | 364/572 |
| 5,684,653 | 11/1997 | Knowles | 360/78.04 |
| 5,855,268 | 1/1999 | Zoladz | 194/207 |

*Primary Examiner*—Benny Lee
*Assistant Examiner*—Henry Choe

[57] ABSTRACT

An integrated circuit differential amplifier with a digitally controllable gain. In a preferred embodiment, the differential amplifier employs first and second transconductance (gm) amplifiers and a digital to analog converter (DAC). The first gm amplifier converts a differential input voltage into a differential output current and the second gm amplifier converts the differential output current into a differential output voltage. A digital input code is applied to the DAC to generate an analog output voltage that is applied to one of the gm amplifiers to control its transconductance to thereby control the gain of the differential amplifier. The second gm amplifier employs a pair of low impedance feedback paths between input/output terminals of opposite polarity. The gain of the differential amplifier is thus a function of the ratio of the transconductance of the first gm amplifier to that of the second gm amplifier. Preferably, the same circuit topology is employed for both gm amplifiers, leading to a process- and operating temperature-insensitive differential amplifier gain. Additional gm amplifiers may be connected in parallel with the first gm amplifier to enhance gain. The load resistance presented by the second gm amplifier is preferably kept low to afford high speed operation.

19 Claims, 4 Drawing Sheets

HIGH SPEED, FINE-RESOLUTION GAIN PROGRAMMABLE AMPLIFIER

FIELD OF THE INVENTION

The present invention relates generally to integrated circuit amplifiers and, more particularly, to a high speed gain-programmable amplifier with fine gain resolution.

BACKGROUND OF THE INVENTION

Integrated circuit gain-programmable amplifiers are employed in a wide range of electronic equipment, such as within wireless communications receivers, medical equipment, radar, and so forth. A typical gain-programmable amplifier includes an operational amplifier (op-amp) with a variable feedback resistor that is varied by the user or manufacturer to establish a fixed gain or to dynamically control the gain during amplifier operation.

FIG. 1 illustrates a conventional differential type of gain-programmable amplifier 10. A differential input voltage (Vip−Vin) is applied to the amplifier and amplified by op-amp 16 is to produce a differential output voltage (Vop−Von)=G(Vip−Vin), where G is the overall gain of the amplifier 10. The gain is controllable by varying the resistance of a pair of resistor networks $R_{S1}, R_{S2}$ coupled to the respective op-amp input terminals, and by varying the resistance of a pair of feedback resistor networks $R_{F1}, R_{F2}$. Each variable resistor network consists of a number of parallel-connected resistors R, with each resistor selectively connected to the parallel circuit via an associated switch S. Thus, by selectively switching the individual switches S on or off, the effective resistance of each resistor network is controlled to thereby influence the amplifier gain. The number of gain settings of amplifier 10 equals the total number of switches in all four resistor networks $R_{S1}, R_{S2}, R_{F1}$ and $R_{F2}$.

One shortcoming of the amplifier of FIG. 1 is that in practice, the circuit topology limits the amplifier bandwidth as well as the gain setting resolution. Increasing the number of settings to enhance gain resolution requires increasing the number of switches and resistors in the resistor networks. The larger number of switches and resistors, however, wastes silicon area and also results in a reduction of the amplifier bandwidth.

Amplifiers with digitally controllable gains are also in the prior art. See, e.g., U.S. Pat. No. 5,451,901 to D. Welland, which discloses an automatic gain control circuit employing a series connection of a transconductance amplifier having a digitally controllable transconductance, and a dynamically variable resistance circuit. The combination approximates an exponential response to a gain control signal.

SUMMARY OF THE INVENTION

The present invention is directed towards an integrated circuit differential amplifier with a digitally controllable gain. In a preferred embodiment, the differential amplifier employs first and second transconductance amplifiers (gm amplifiers) and a digital to analog converter (DAC). The first gm amplifier converts a differential input voltage into a differential output current, and the second gm amplifier converts the differential current to a differential output voltage. A digital input code is applied to the DAC to generate an analog voltage that is applied to one of the gm amplifiers to control its transconductance to thereby control the gain of the differential amplifier. Preferably, the second gm amplifier employs a pair of low impedance feedback paths between input/output terminals of opposite polarity.

The overall gain of the differential amplifier is thus a function of the ratio of the transconductance of the first gm amplifier to that of the second gm amplifier. A fixed gm control voltage may be applied to the second gm amplifier so that it presents a fixed parasitic load to the first gm amplifier, resulting in a substantially constant bandwidth for the differential amplifier over a range of gain settings.

BRIEF DESCRIPTION OF THE DRAWINGS

The following detailed description, given by way of example and not intended to limit the present invention solely thereto, will best be appreciated in conjunction with the accompanying drawings, in which like reference numerals denote like parts or elements, wherein.

DETAILED DESCRIPTION OF CERTAIN PREFERRED EMBODIMENTS

Figure 2:
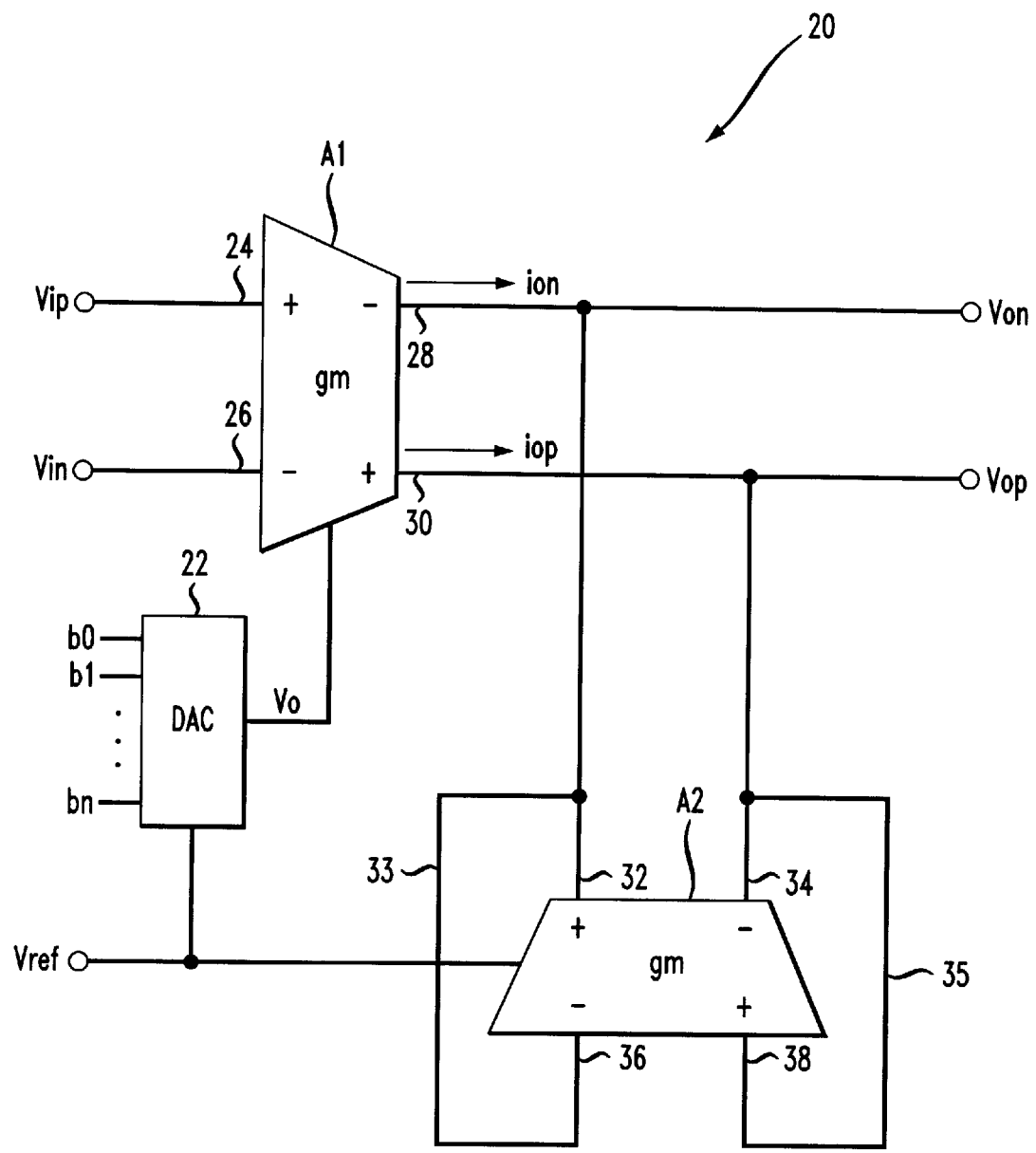
FIG. 2 is a circuit diagram of an embodiment of a digitally controllable amplifier in accordance with the invention.

With reference to FIG. 2, an illustrative digitally controllable differential amplifier in accordance with the invention is schematically illustrated, designated as 20. Differential amplifier 20 is comprised of a pair of integrated circuit transconductance (gm) amplifiers A1 and A2 and a digital to analog converter (DAC) 22. Gm amplifiers A1 and A2 preferably have the same circuit topology so as to form differential amplifier 20 with an overall gain that is generally insensitive to manufacturing process and operating temperature variations. As will become apparent below, the gain of differential amplifier 20 is a function of the ratio of the transconductance of gm amplifier A1 to the transconductance of gm amplifier A2. Advantageously, by using the same design for amplifiers A1 and A2, process and temperature variations change the transconductance of amplifiers A1 and A2 by about the same factor, so that the overall differential amplifier gain does not change. Consequently, when the differential amplifier is programmed using a specific input code to obtain a target gain, that gain is more easily realized even in the face of manufacturing process variations, and remains relatively constant with temperature fluctuations.

With continuing reference to FIG. 2, a digital input code is applied to input terminals b0, b1, . . . bn of DAC 22 to generate an analog output voltage Vo. This voltage is applied to gm amplifier A1 to control its transconductance gm1. A reference voltage Vref is applied as a gm control voltage to amplifier A2 to set its transconductance gm2 to a predetermined value. Reference voltage Vref is also applied to DAC 22 in this embodiment as a reference to establish the range of the DAC output voltage Vo for all possible input codes. Thus, in this embodiment, Vref represents the maximum value of Vo. The gain of the overall amplifier 20 is variable as a function of the programmable digital input code applied to DAC 22.

One advantage of controlling the gain by digitally controlling only Vo, and not Vref, is that the parasitic load (resistive and reactive) presented by gm amplifier A2 remains constant. The differential amplifier bandwidth is a function of the parasitic load on amplifier A1. Therefore, keeping this load constant by applying a constant gm control voltage Vref to gm amplifier A2 results in a generally fixed amplifier bandwidth over a range of gain settings. The number of gain settings (for a fixed gm control voltage applied to amplifier A2) corresponds to the number of possible binary input codes applied to DAC 22, i.e., $2^{n+1}$ for n+1 DAC input terminals b0 to bn.

Differential amplifier 20 operates to amplify a differential input voltage (Vip−Vin) to produce a differential output voltage (Vop−Von). Input voltage Vip is applied to non-inverting terminal 24 of amplifier A1; Vin is applied to inverting terminal 26. Input voltages Vip and Vin each include a DC bias component of preferably the same value, e.g., about 2V. An AC signal to be amplified is applied between the input terminals 24, 26 to produce a common mode differential input voltage (Vip−Vin). Amplifier A1 generates an output current iop at its non-inverting output terminal 30 and an output current ion at its inverting output terminal 28 according to:

$$(iop-ion)=gm1(Vip-Vin), \qquad (1)$$

where gm1 is the transconductance of amplifier A1 as controlled with voltage Vo from DAC 22.

Transconductance amplifier A2 is arranged with a pair of low impedance or short-circuit feedback paths between output/input terminals of opposite polarity—i.e., non-inverting output terminal 32 is shorted to inverting input terminal 36 via feedback path 33, and inverting output terminal 34 is shorted to non-inverting input terminal 38 via feedback path 35. Output terminal 28 of amplifier A1 is coupled to terminals 32 and 36 of A2 whereas output terminal 30 of A1 is coupled to terminals 34 and 38 of A2. In the alternative, the connections of the amplifier A1 output terminals can be flipped so that output terminal 28 is connected to terminals 34 and 38 and output terminal 30 connects to terminals 32 and 36. In either configuration, gm amplifier A2 effectively converts the differential output current (iop-ion) of amplifier A1 to a differential output voltage (Vop−Von) in a manner wherein the overall transfer function of amplifier 20 is expressed as:

$$(Vop-Von)=gm1(Vip-Vin)/gm2, \qquad (2)$$

where gm2 is the transconductance of amplifier A2 as controlled by gm control voltage Vref. The gain G of amplifier 20 thus equals gm1/gm2, where gm1 and gm2 are proportional to Vo and Vref, respectively.

Although the second gm amplifier A2 may be functional in other applications as a transconductance amplifier to convert a differential input voltage to a differential output current, it is used here essentially as a resistance device to convert a differential input current (iop−ion) to a differential output voltage (Vop−Von). Hence, the gm control voltage (gm bias voltage) Vref applied to amplifier A2 actually controls the resistance $R_2=1/gm2$ of amplifier A2.

Preferably, the same amplifier design is used for both gm amplifiers A1 and A2, and the two amplifiers are fabricated on the same integrated circuit chip. With this approach, device process variations and temperature variations during operation of amplifier 20 affect the transconductance of each amplifier by the same factor. More specifically, the transconductance of each amplifier A1 and A2 can be expressed as:

$$gm=\beta Vc, \qquad (3)$$

where Vc is the gm control voltage applied to the amplifier, and β is a transconductance factor which is dependent on the integrated circuit manufacturing process and the amplifier operating temperature. If amplifiers A1 and A2 are of the same design then the parameter β is the same for both amplifiers. In this case, if gm control voltage Vc=Vo=KVref is applied to amplifier A1, where K<1, then, $$gm1=\beta KVref, \qquad (4)$$

and, $$gm2=\beta Vref \qquad (5)$$

so that the differential amplifier gain G=gm1/gm2 equals the constant K which, ideally, is solely a function of the digital input code applied to DAC 22. Therefore, even though the value β and the transconductance of each amplifier A1 and A2 are variable as a function of manufacturing process and operating temperature fluctuations, the overall differential amplifier gain is not. Hence, the differential amplifier gain is predictable as a function of the digital input code.

The configuration of amplifier 20 can be modified in several ways. For instance, the roles of reference voltage Vref and DAC output voltage Vo may be reversed by applying Vref as the bias to amplifier A1 and Vo as the bias for A2. Variable gain would then be achievable by varying Vo to alter the transconductance of A2 while the transconductance of A1 remains fixed. As another modification, a second DAC may be employed to produce a programmable output voltage which would be applied as a gm control voltage to amplifier A2 in place of reference voltage Vref. This modification would allow for even finer resolution in gain settings, but of course at the expense of additional space needed for the second DAC. Alternatively, with one DAC employed, the DAC analog output may be applied to one of the gm amplifiers to control its transconductance while a modified version of the analog output (e.g., inverted output) is applied to the other gm amplifier to control that amplifier's transconductance to thereby control the overall gain. With either of these approaches, the variation in the transconductance of amplifier A2 changes the load resistance of amplifier A1, resulting in an operating bandwidth that is a function of the gain setting.

Figure 1:
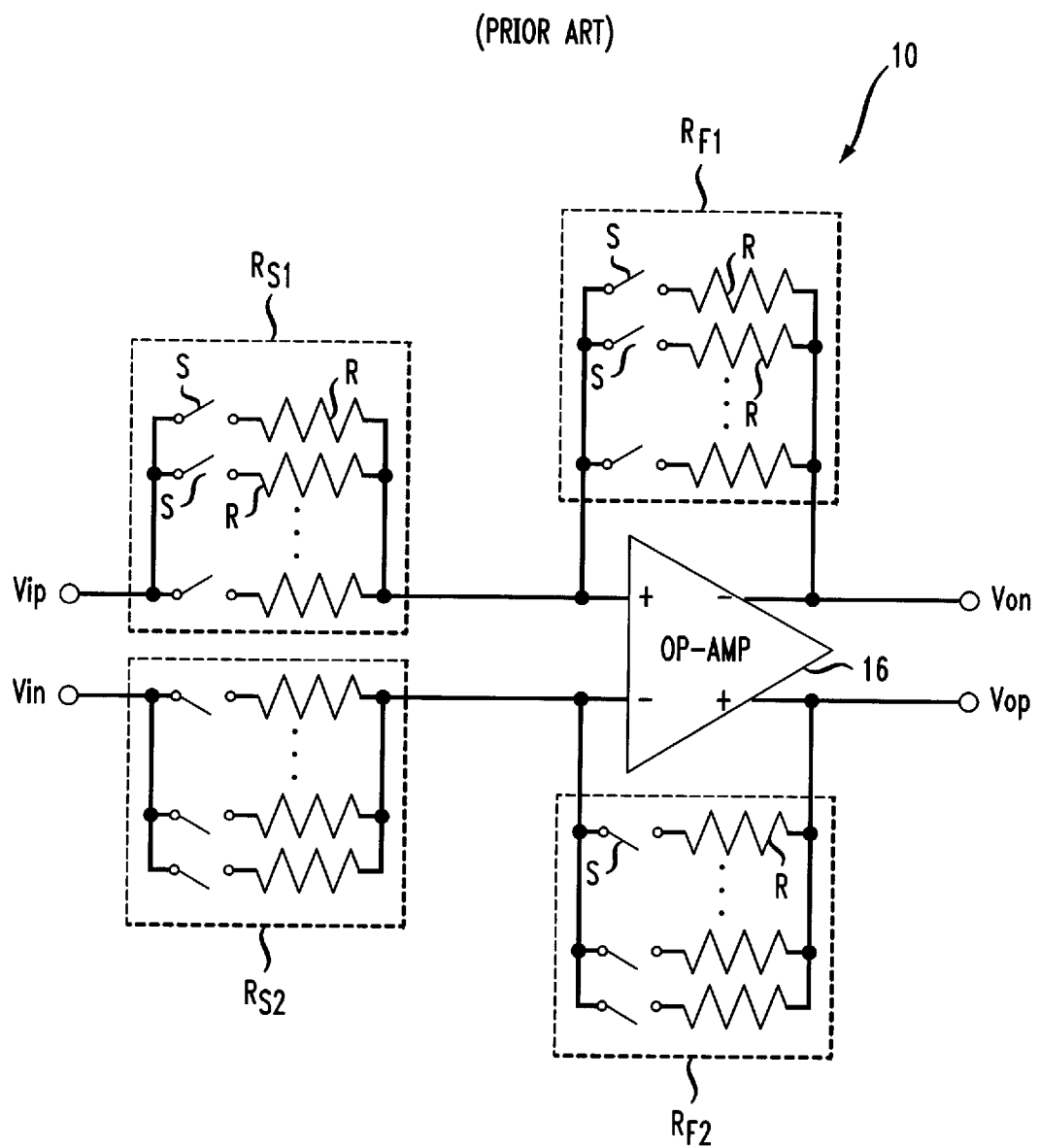
FIG. 1 illustrates a prior art differential amplifier with adjustable gain.

As mentioned previously, it is desirable to: 1) use the same amplifier designs for gm amplifiers A1 and A2 to render the differential amplifier gain process and temperature-insensitive; and, 2) to apply the relatively high gm control voltage Vref to gm amplifier A2 to achieve a high transconductance, and hence, low resistance, for amplifier A2 to attain high speed operation. By way of example, amplifier operation from 0–200MHz is achievable with this approach in 0.35 um CMOS technology. This compares to about 0–60MHz operation for the amplifier configuration of FIG. 1. For the configuration shown in FIG. 2, however, if amplifiers A1 and A2 are the same, gm2 will always be larger than or equal to gm1 because Vref≧Vo. Since the differential amplifier gain G=gm1/gm2, the gain will always be less than unity, resulting in an amplifier that is essentially a variable attenuator. While this result may suffice for certain applications, a programmable gain larger than unity can be realized with the configuration of FIG. 3.

Figure 3:
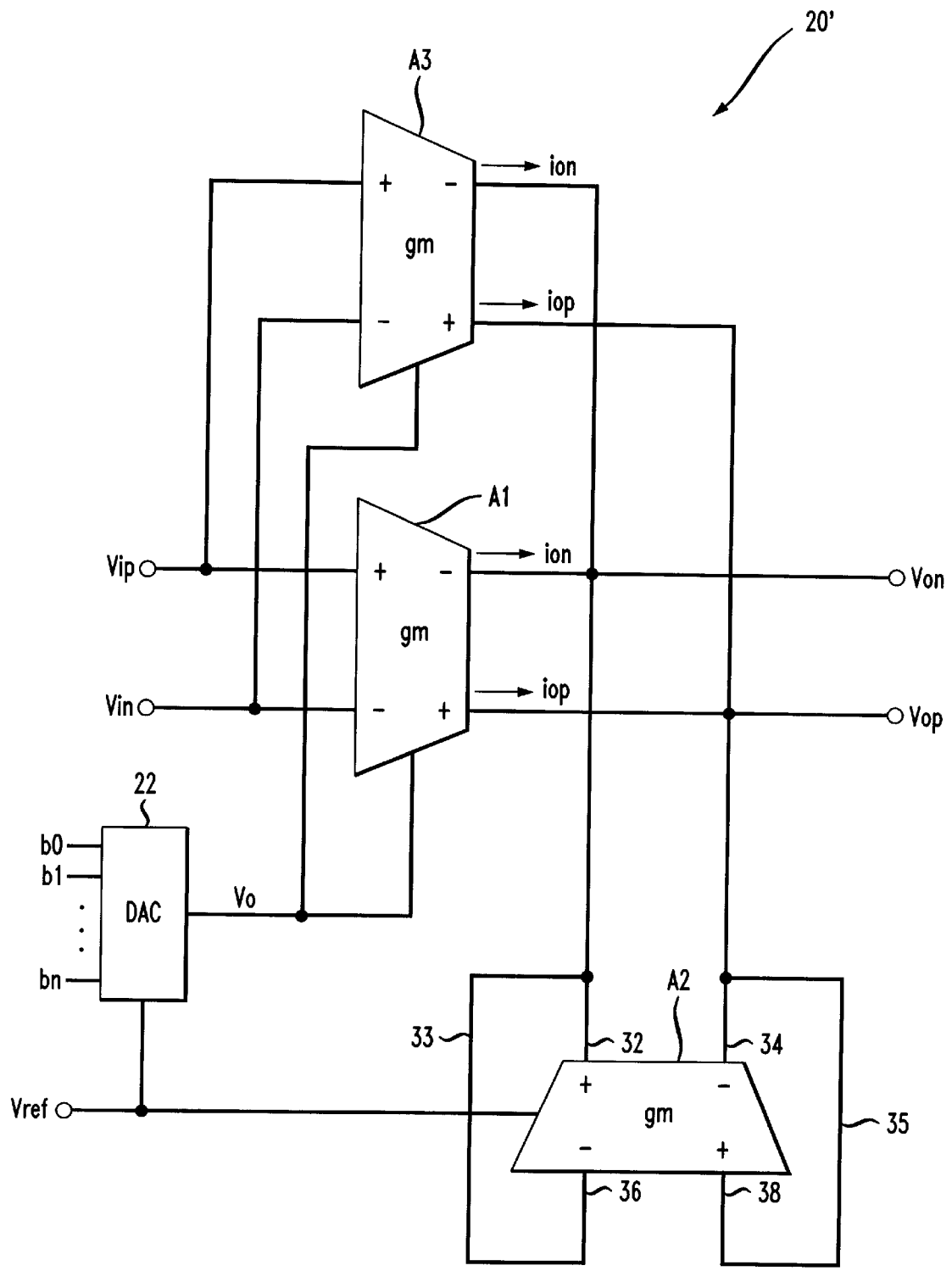
FIG. 3 schematically illustrates another embodiment of the invention.

Referring to FIG. 3, differential amplifier 20' differs from amplifier 20 of FIG. 2 via the addition of a supplemental gm amplifier A3 connected in parallel with gm amplifier A1. That is, the non-inverting input terminals of amplifiers A1 and A3 are electrically connected, as are the inverting input terminals, the non-inverting output terminals and the inverting output terminals. Preferably, amplifier A3 has the same circuit topology as amplifiers A1 and A2. The same gm control voltage Vo can be applied to amplifiers A1 and A3 such that the transconductance gm3 of amplifier A3 is equal to that of amplifier A1 (assuming the two amplifiers have the same design). Hence, amplifier A3 produces output currents iop and ion having the same values as those of amplifier A1. The currents flowing into gm amplifier A2 are then 2iop and 2ion, resulting in an overall gain for differential amplifier 20' as:

$$G=(gm1+gm3)/gm2. \quad (6)$$

Accordingly, since the transconductance gm2 of amplifier A2 is kept relatively high and its resistance (1/gm2) low, increased gain is obtained with the addition of amplifier A3 without sacrificing operating speed and bandwidth. Gain can be increased further by connecting still more gm amplifiers in parallel with amplifier A1 and preferably by applying the voltage Vo as the gm control voltage to each additional gm amplifier.

Figure 4:
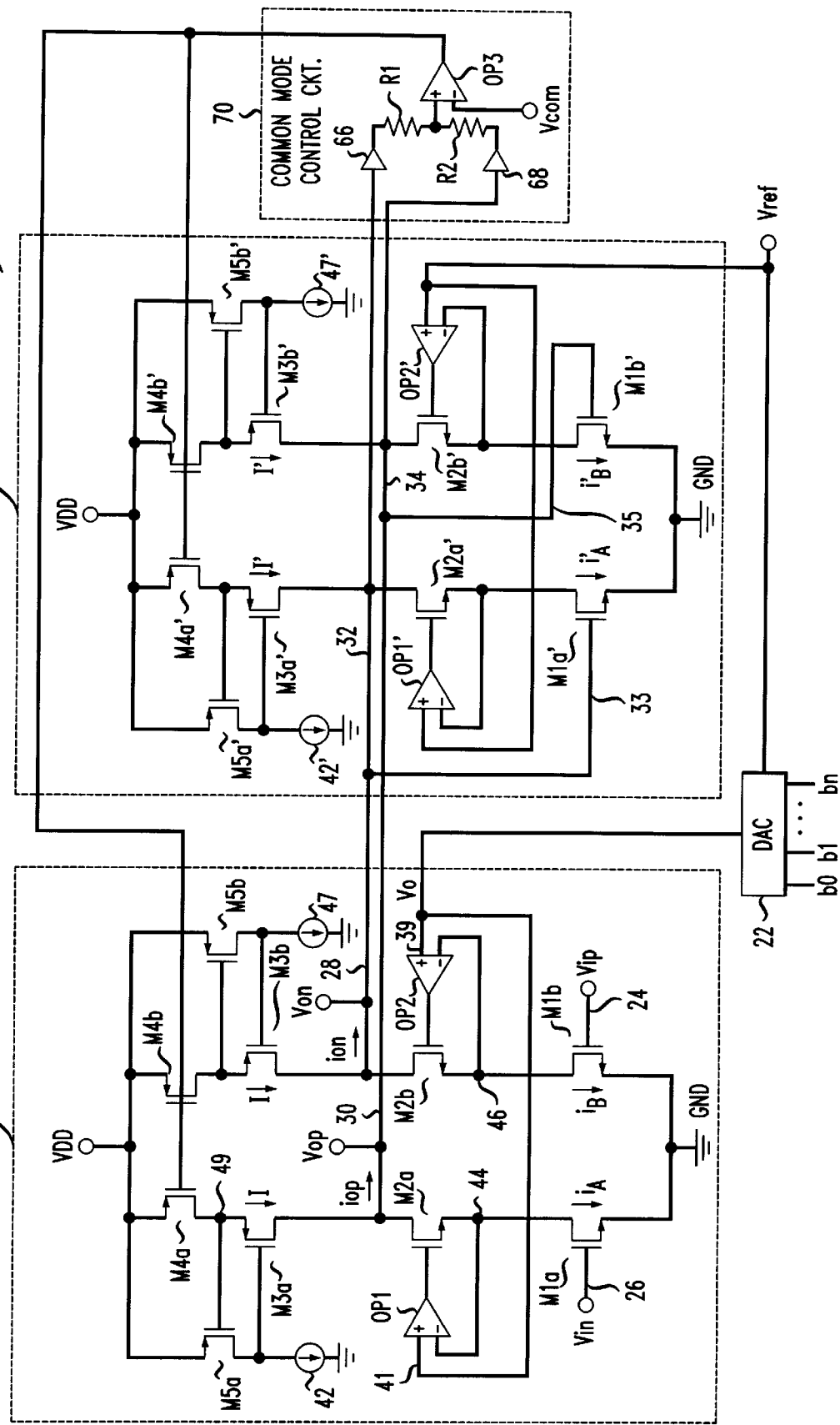
FIG. 4 schematically illustrates a digitally controllable amplifier including specific embodiments for transconductance amplifiers employed therein.

Referring now to FIG. 4, a specific embodiment of gain-programmable amplifier 20 is shown. In this example, the same basic circuit topology is employed for both transconductance amplifiers A1 and A2. One exception is the presence of a pair of short circuit feedback paths 33, 35 in amplifier A2 as discussed previously. The shown configuration can be expanded to obtain higher gain by connecting one or more gm amplifiers in parallel with amplifier A1 as was described in connection with FIG. 3.

In operation of amplifier A1, the differential input voltage (Vip−Vin) is applied across gate terminals 24 and 26 of n-channel FETS (nFETS) M1$b$ and M1$a$, respectively. Input voltages Vip, Vin each include a DC bias component of typically about 2V and an AC component comprising the signal to be amplified. Gm control voltage Vo from DAC 22 is supplied to non-inverting terminal 39 of op-amp OP2 and also to non-inverting terminal 41 of op-amp OP1. The application of unequal voltages Vip, Vin causes unequal currents $i_A$, $i_B$ to flow on the two halves of the circuit. These currents in turn produce corresponding unequal output currents iop, ion which are applied to gm amplifier A2 and converted thereby to produce the desired differential output voltage Vop−Von.

Referring to gm amplifier A1, op-amps OP1 and OP2 are high gain devices, e.g., 60 dB or higher, and preferably have identical circuit topologies. Conventional op-amp designs may be employed for OP1 and OP2, with typically 15–20 transistors in each op-amp. The inverting terminal of op-amp OP2 connects to circuit node 46 between the drain of transistor M1$b$ and the source of nFET M2$b$. Symmetrically, the inverting terminal of op-amp OP1 connects to a circuit node 44 connecting the drain of nFET M1$a$ and the source of nFET M2$a$. The sources of devices M1$a$ and M1$b$ are commonly connected to a point of low reference potential (e.g., ground or negative supply voltage). The output voltage of op-amp OP1 is applied to the gate of FET M2$a$. Likewise, the output voltage of OP1 is applied to the gate of FET M2$b$.

The above-described closed loop arrangement of each op-amp OP1 and OP2, i.e., with feedback paths from the sources of nFETS M2$a$ and M2$b$ to the inverting inputs of op-amps OP1 and OP2, respectively, serves to maintain the voltage at each circuit node 44 and 46 substantially equal to the gm control voltage Vo applied to the op-amp non-inverting terminals. As such, the circuit arrangement is essentially a voltage follower, in which the voltage at circuit nodes 44 and 46 follow the input control voltage Vo. Also, the sources of FETS M2$a$ and M2$b$ are effectively isolated from one another.

The differential input voltage (Vip−Vin) produces a differential output current (iop-ion)=Gm1(Vip−Vin) as follows:

The circuit arrangement of pFETS M3$a$, M3$b$, M4$a$, M4$b$, M5$a$, M5$b$ and current sources 42, 47 functions to provide equal current flow I on both sides of the circuit, as will be explained later. The drains of FETS M1$a$ and M1$b$ are maintained at the control voltage Vo as discussed above. Since the sources of M1$a$ and M2$a$ are tied to ground, the drain to source voltage $V_{DS}$ of each device M1$a$ and M2$a$ is always a constant value, i.e., Vo volts. Therefore, the drain to source current $i_{DS,M1a}$ through FET M1$a$ (hereafter, $i_A$), for a given control voltage Vo, is directly related to the applied gate voltage Vin. Likewise, the drain to source current $i_{DS,M1b}$ through FET M1$b$ (hereafter, $i_B$) is directly related to the gate voltage Vip. More specifically, the following square law equations describe the relationship between currents $i_A$, $i_B$, the control voltage Vo, and the input voltages Vin and Vip:

$$i_A = \beta[(Vin-V_T)Vo-Vo^2/2];$$
$$i_B = \beta[(Vip-V_T)Vo-Vo^2/2], \quad (7)$$

where $V_T$ is the threshold voltage of the respective nFET, typically on the order of 0.7V, and $\beta$ is the aforementioned transconductance factor. A typical value for $\beta$ is on the order of 150 millisiemens, for example.

The output currents ion and iop can be determined from Kirchoff's law as follows:

$$iop = I - i_A$$
$$ion = I - i_B. \quad (8)$$

The differential output current (iop−ion) is then determined as:

$$\begin{aligned}(iop - ion) &= i_B - i_A \quad (9)\\ &= \beta[(Vip - V_T)V_0 - V_0^2/2] - \\ &\quad \beta[(Vin - V_T)V_0 - V_0^2/2]\\ &= \beta V_o(Vip - Vin)\\ &= gm(Vip - Vin).\end{aligned}$$

Accordingly, it is seen that the differential output current (iop−ion) from amplifier A1 is directly related to the DAC analog output voltage Vo. Merely by way of example, for transistors designed for 5V operation (VDD=5V) the control voltage Vo is typically varied in the range of about 0–0.8V to obtain a desired transconductance.

To provide equal current flow I on both sides of the circuit, pFETS M3$a$ and M4$a$ are connected in a cascode arrangement between a source of supply voltage VDD and the drain of nFET M2$a$. These devices present a high output impedance from the vantage point of node 30. Likewise, on the right half of the circuit, the cascode connection of pFETS M3$b$ and M4$b$ present high output impedance as seen from node 28. A bias voltage from common mode control circuit 70 is applied to the gates of devices M4$a$ and M4$b$ such that the devices operate as resistors. Control circuit 70 includes a pair of buffers 66, 68 with inputs coupled to circuit nodes 28 and 30, respectively, and an op-amp OP3 with a non-inverting input terminal connected to a circuit node between a pair of resistors R1 and R2. A common mode bias voltage $V_{COM}$ of typically VDD/2 is applied to the inverting input of op-amp OP3. The op-amp output is applied to the gates of devices M4$a$ and M4$b$ and also to the gates of devices M4$a'$ and M4$b'$ of amplifier A2 to maintain equal resistance and hence, equal current flow on the left and right sides of each amplifier circuit.

The output resistance with respect to node 30 is boosted by the provision of another pFET M5a and a current source 42. For example, these components may be used to boost the output resistance by a factor of 10. The gate of FET M5a is coupled to circuit node 49; the source of M5a receives supply voltage VDD; and the drain of M5a is coupled to current source 42. On the right half of the circuit, pFET M5b and current source 47 are connected in an analogous manner to boost output resistance with respect to node 28. Current sources 42 and 47 may each be conventional current sources formed with two transistors and an appropriate biasing arrangement.

The output currents iop and ion are applied to amplifier A2 to generate the output voltages Vop and Von according to:

$$Vop-Vip=(1/gm2)(iop-ion) \quad (10)$$

where transconductance gm2 is proportional to control voltage Vref applied to the non-inverting terminals of op-amps OP1' and OP2'. The components of gm amplifier A2 are preferably identical to those of amplifier A1—the corresponding components are designated with primes (e.g., transistor M1a' performs an analogous function as transistor M1a, and so forth). Circuit node 34 is the connection point between the drains of nFET M2b' and pFET M3b', and is also tied to the gate of nFET M1b' via feedback path 35. Similarly, circuit node 32 is the connection point between the drains of nFET M2a' and pFET M3a' and is tied via feedback path 33 to the gate of nFET M1a'. In the shown configuration, nodes 34, 30 and 32, 28 are connected; however, the connections can be interchanged (with node 34 connecting to node 28 and node 32 to node 30) to obtain the same differential output voltage due to the symmetrical left/right topology of gm amplifier A2.

From the foregoing, thus disclosed is a fully differential amplifier with a digitally controllable gain employing series connected transconductance amplifiers. Advantageously, the differential amplifier can be designed with a large number of gain settings for a given silicon area to provide fine resolution. By using the same circuit design for each gm amplifier, the differential amplifier voltage gain is predictable as a function of the digital input code and the gain remains substantially constant with operating temperature and supply voltage fluctuations.

While the present invention has been described above with reference to specific embodiments thereof, it is understood that one skilled in the art may make many modifications to the disclosed embodiments without departing from the spirit and scope of the invention. For instance, while specific circuit designs have been shown and described for each transconductance amplifier, other gm amplifier designs may alternatively be employed. Further, the specific gm amplifiers as presented in FIG. 4 may be employed without the digital to analog converter in a some applications, in which case the gm control voltages applied to each gm amplifier can be provided as a fixed or variable voltage by another means. Accordingly, these and other modifications are intended to be included within the scope of the invention as defined by the appended claims.

What is claimed is:

1. An integrated circuit comprising a differential amplifier for amplifying a differential input voltage, characterized in that said differential amplifier comprises:

a first transconductance amplifier operative to convert said differential input voltage to a differential output current in accordance with a first transconductance thereof;

a second transconductance amplifier biased so as to provide a second transconductance and operative to convert said differential output current to a differential output voltage, said second transconductance amplifier having a pair of feedback paths between output/input terminals thereof; and, a digital to analog converter (DAC) for converting a digital input code to an analog value, said analog voltage being applied to one of said first and second transconductance amplifiers to control the transconductance thereof;

wherein the gain of said differential amplifier is a function of a ratio of said first transconductance to said second transconductance.

2. The integrated circuit of claim 1 wherein said second transconductance amplifier includes non-inverting and inverting input terminals for receiving said differential output current of said first transconductance amplifier, and further including a first low impedance feedback path connected between a non-inverting output terminal thereof and said inverting input terminal, and a second low impedance feedback path connected between an inverting output terminal thereof and said non-inverting input terminal.

3. The integrated circuit of claim 1 wherein said second transconductance amplifier has a substantially identical circuit topology as said first transconductance amplifier, and wherein said pair of feedback paths of said second transconductance amplifier having a low impedance and being connected between output/input terminals thereof of opposite polarity.

4. The integrated circuit of claim 1, wherein:

said DAC is connected to receive a reference voltage that controls a range of said analog voltage for all possible digital input codes, said analog voltage thereby being a function of both said reference voltage and the digital input code applied to said DAC; and, said reference voltage is further applied to the other of said first and second transconductance amplifiers to set the transconductance thereof.

5. The integrated circuit of claim 4 wherein said analog voltage output by said DAC is applied to said first transconductance amplifier to control said first transconductance and said reference voltage is applied to said second transconductance amplifier to set said second transconductance to a fixed value.

6. The integrated circuit of claim 1 wherein said first and second transconductance amplifiers are arranged so that voltage gain of said differential amplifier is substantially the ratio of said first transconductance to said second transconductance.

7. The integrated circuit of claim 1, further comprising at least one additional transconductance amplifier connected in parallel with said first transconductance amplifier to increase gain of said differential amplifier.

8. An integrated circuit comprising a differential amplifier for amplifying a differential input voltage, characterized in that said differential amplifier comprises:

a first transconductance amplifier operative to convert said differential input voltage to a differential output current in accordance with a first transconductance thereof;

a second transconductance amplifier biased so as to provide a second transconductance and operative to convert said differential output current to a differential output voltage, said second transconductance amplifier having substantially identical circuit topology as said first transconductance amplifier plus a pair of low impedance feedback paths connected between input/output terminals thereof of opposite polarity; and, a digital to analog converter (DAC) for converting a digital input code to an analog voltage, said analog voltage being applied to one of said first and second transconductance amplifiers to control the transconductance thereof;

wherein the gain of said differential amplifier is a function of the ratio of said first transconductance to said second transconductance, and said first transconductance and said second transconductance vary by about the same percentage as a function of operating temperature such that said gain is substantially constant with operating temperature.

9. The integrated circuit of claim 8, further comprising at least one additional transconductance amplifier connected in parallel with said first transconductance amplifier to increase gain of said differential amplifier.

10. The integrated circuit of claim 8 wherein said DAC receives a reference voltage that controls a range of said analog voltage for all possible digital input codes, and said reference voltage is further applied as a transconductance control voltage to the other of said first and second transconductance amplifiers to set a fixed transconductance thereof.

11. The integrated circuit of claim 10 wherein said analog voltage is applied to said first transconductance amplifier to control its transconductance, said reference voltage is applied to said second transconductance amplifier, and further comprising at least one additional transconductance amplifier connected in parallel with said first transconductance amplifier to increase gain of said differential amplifier.

12. The integrated circuit of claim 11 wherein said additional amplifier has the same circuit topology of said first transconductance amplifier such that transconductance of said additional transconductance amplifier varies by about the same percentage as said first transconductance with operating temperature to maintain a substantially constant gain with temperature.

13. The integrated circuit of claim 12 wherein said analog output voltage of said DAC is also applied as a transconductance control voltage to said additional amplifier.

14. An integrated circuit comprising a differential amplifier for amplifying a differential input voltage, characterized in that said differential amplifier comprises:

a first transconductance amplifier operative to convert said differential input voltage to a differential output current in accordance with a first transconductance thereof;

a second transconductance amplifier biased so as to provide a second transconductance and operative to convert said differential output current to a differential output voltage, said second transconductance amplifier having a substantially identical circuit topology as said first transconductance amplifier plus a pair of low impedance feedback paths connected between input/output terminals thereof of opposite polarity;

a digital to analog converter (DAC) for converting a digital input code to an analog voltage, said analog voltage being applied to one of said first and second transconductance amplifiers to control the transconductance thereof;

wherein the gain of said differential amplifier is a function of the ratio of said first transconductance to said second transconductance, and said first transconductance and said second transconductance vary by about the same percentage as a function of operating temperature such that said gain is substantially constant with operating temperature; and, each of said first and second transconductance amplifiers comprises:

first and second circuit parts, each circuit part having first and second n-channel field effect transistors (nFETS) and an operational amplifier, with source terminals of said first nFETs in the circuit parts being commonly connected to a point of low reference potential;

each operational amplifier connected to receive an input transconductance control voltage at a non-inverting input terminal thereof, with an inverting terminal thereof being connected to a circuit node between a drain terminal of said first nFET and a source terminal of the second nFET in the associated circuit part, each second nFET having a drain terminal connected to a respective output resistance which is connected to a source of supply voltage;

each operational amplifier having an output terminal coupled to a gate terminal of the second nFET in the associated circuit part, to thereby maintain the potential at said circuit node in the associated circuit part substantially equal to said input transconductance control voltage; and, said differential input voltage being applied across the gate terminals of said first nFETs of said first transconductance amplifier, said differential output current being applied to gate terminals of said first nFETs of said second transconductance amplifier, and said differential output voltage appearing across second and third circuit nodes corresponding to drain terminals of said second nFETs of said first and second circuit parts, respectively.

15. The integrated circuit of claim 14 wherein said output resistance in each of said first and second circuit parts comprises:

a first pFET having a gate terminal connected to receive a bias voltage and a source terminal connected to a source of supply voltage;

a second pFET having a source terminal coupled to a drain terminal of the first pFET in the associated circuit part, a gate terminal connected to a constant current source, and a drain terminal coupled to said drain terminal of said second nFET in the associated circuit part; and, a third pFET having a source terminal connected to said source of supply voltage, a gate terminal coupled to said drain terminal of the first pFET in the associated circuit part and a drain terminal connected to said constant current source.

16. The integrated circuit of claim 15, further comprising a common mode control circuit for supplying said bias voltage applied to said gate terminal of said first pFET in each circuit part of said first and second transconductance amplifiers.

17. The integrated circuit of claim 16 wherein said common mode control circuit comprises first and second buffers having inputs coupled to said drain terminals of said second nFETs of said first and second circuit parts, respectively, first and second resistors coupled to output terminals of the respective buffers, and an operational amplifier having a non-inverting terminal connected to a circuit node between said first and second resistors, an inverting terminal that receives a common mode supply voltage, and an output terminal that provides said bias voltage.

18. The integrated circuit of claim 14 wherein said transconductance control voltage applied to said first transconductance amplifier comprises said analog output voltage of said digital to analog converter, and said transconductance control voltage applied to said second transconductance amplifier is fixed.

19. The integrated circuit of claim 18 wherein said transconductance control signal applied to said second transconductance amplifier comprises a reference voltage which is also applied to said DAC to establish a range of said analog voltage for all possible digital input codes.

* * * * *